US011610427B2

(12) United States Patent
Lundahl

(10) Patent No.: US 11,610,427 B2
(45) Date of Patent: Mar. 21, 2023

(54) ULTRASONIC TRANSDUCER DEVICE, ACOUSTIC BIOMETRIC IMAGING SYSTEM AND MANUFACTURING METHOD

(71) Applicant: FINGERPRINT CARDS AB, Gothenburg (SE)

(72) Inventor: Karl Lundahl, Gothenburg (SE)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 318 days.

(21) Appl. No.: 16/645,908

(22) PCT Filed: Sep. 17, 2018

(86) PCT No.: PCT/SE2018/050938
§ 371 (c)(1),
(2) Date: Mar. 10, 2020

(87) PCT Pub. No.: WO2019/059833
PCT Pub. Date: Mar. 28, 2019

(65) Prior Publication Data
US 2020/0279088 A1    Sep. 3, 2020

(30) Foreign Application Priority Data
Sep. 22, 2017   (SE) .................................. 1751185-8

(51) Int. Cl.
*G06V 40/13*    (2022.01)
*B06B 1/06*     (2006.01)
(Continued)

(52) U.S. Cl.
CPC ........ *G06V 40/1306* (2022.01); *B06B 1/0622* (2013.01); *H01L 41/0472* (2013.01);
(Continued)

(58) Field of Classification Search
CPC ............... H01L 41/0472; H01L 41/083; H01L 41/1132; H01L 41/187; H01L 41/22; H01L 41/25; H01L 41/27; B06B 1/0622
See application file for complete search history.

(56) References Cited

U.S. PATENT DOCUMENTS 5,577,319 A    11/1996   Knecht
6,159,149 A    12/2000   Erikson et al.
(Continued)

FOREIGN PATENT DOCUMENTS

CN    112115753 A  * 12/2020   ............... B06B 1/06
JP    2009164333 A    7/2009
WO    2010031192      6/2010

OTHER PUBLICATIONS

PCT International Search Report and Written Opinion dated Jan. 16, 2019 for International Application No. PCT/SE2018/050938, 15 pages.
(Continued)

*Primary Examiner* — Jeffrey T Carley
(74) *Attorney, Agent, or Firm* — RMCK Law Group, PLC

(57) ABSTRACT

An ultrasonic transducer device for use in an acoustic biometric imaging system, the ultrasonic transducer device comprising: a first piezoelectric element having a first face, a second face opposite the first face, and side edges extending between the first face and the second face; a first transducer electrode on the first face of the first piezoelectric element; a second transducer electrode on the second face of the first piezoelectric element; and a spacer structure leaving at least a portion of the first transducer electrode of the first piezoelectric element uncovered.

8 Claims, 6 Drawing Sheets

(51) Int. Cl.
  *H01L 41/113* (2006.01)
  *H01L 41/047* (2006.01)
  *H01L 41/083* (2006.01)
  *H01L 41/187* (2006.01)
  *H01L 41/22* (2013.01)
  *H01L 41/25* (2013.01)
  *H01L 41/27* (2013.01)

(52) U.S. Cl.
  CPC ........ *H01L 41/083* (2013.01); *H01L 41/1132* (2013.01); *H01L 41/187* (2013.01); *H01L 41/22* (2013.01); *H01L 41/25* (2013.01); *H01L 41/27* (2013.01); *B06B 2201/20* (2013.01)

(56) References Cited

U.S. PATENT DOCUMENTS

| | | | | |
|---|---|---|---|---|
| 10,175,206 | B2* | 1/2019 | Rothberg | G01N 29/2406 |
| 10,512,936 | B2* | 12/2019 | Alie | B81C 1/00238 |
| 10,726,231 | B2* | 7/2020 | Tsai | B81C 1/00301 |
| 2006/0238067 | A1* | 10/2006 | Dausch | B06B 1/0622 |
| | | | | 310/311 |
| 2007/0152537 | A1* | 7/2007 | Yamaguchi | H01L 41/313 |
| | | | | 310/311 |
| 2009/0171216 | A1 | 7/2009 | Sadaka | |
| 2010/0239133 | A1* | 9/2010 | Schmitt | G06V 40/1306 |
| | | | | 310/323.21 |
| 2011/0198968 | A1 | 8/2011 | Sato et al. | |
| 2013/0020907 | A1 | 1/2013 | Bernasseau et al. | |
| 2013/0136321 | A1 | 5/2013 | Lee et al. | |
| 2013/0308286 | A1 | 11/2013 | Horie | |
| 2014/0221841 | A1* | 8/2014 | Okuda | B06B 1/0677 |
| | | | | 600/459 |
| 2014/0232241 | A1 | 8/2014 | Hajati | |
| 2014/0352440 | A1* | 12/2014 | Fennell | H01L 41/25 |
| | | | | 29/25.35 |
| 2014/0355381 | A1* | 12/2014 | Lal | G06N 3/04 |
| | | | | 327/356 |
| 2016/0035959 | A1* | 2/2016 | Mayer | H01L 41/331 |
| | | | | 257/415 |
| 2017/0053151 | A1 | 2/2017 | Yazandoost et al. | |
| 2017/0110504 | A1* | 4/2017 | Panchawagh | B06B 1/0207 |
| 2017/0256699 | A1 | 9/2017 | Kidwell, Jr. et al. | |
| 2017/0352797 | A1* | 12/2017 | Crowder | H01L 41/313 |
| 2018/0314871 | A1* | 11/2018 | He | H01L 41/1132 |
| 2018/0373913 | A1* | 12/2018 | Panchawagh | G01S 7/52079 |

OTHER PUBLICATIONS

European Search Report for EP Application No. 18858825.5 dated Oct. 14, 2020, 16 pages.

* cited by examiner

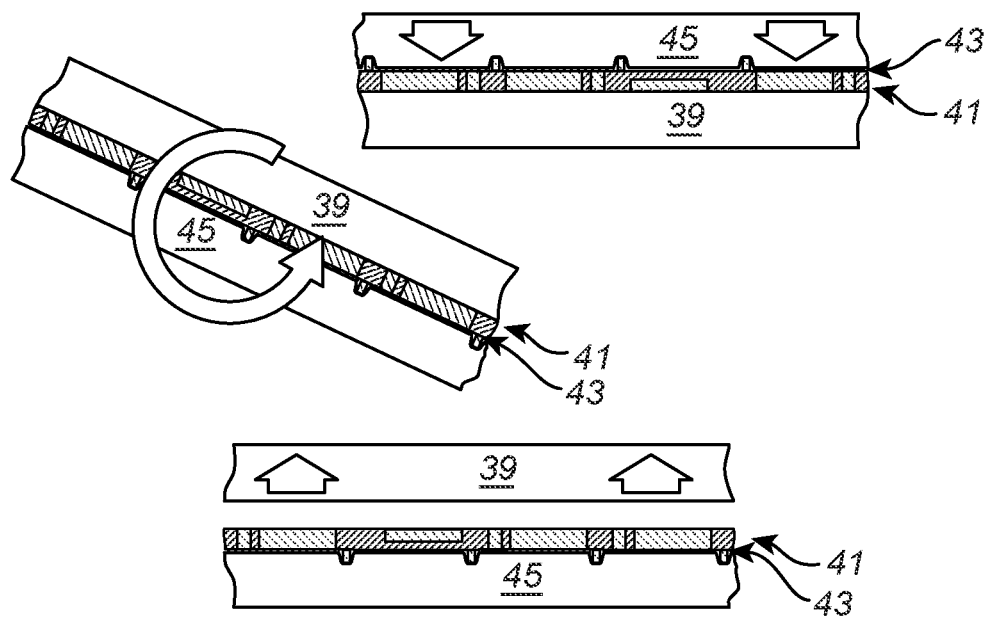
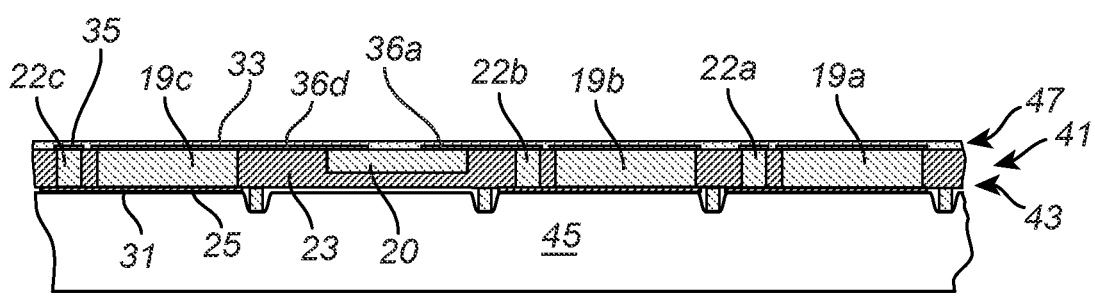
Fig. 4E
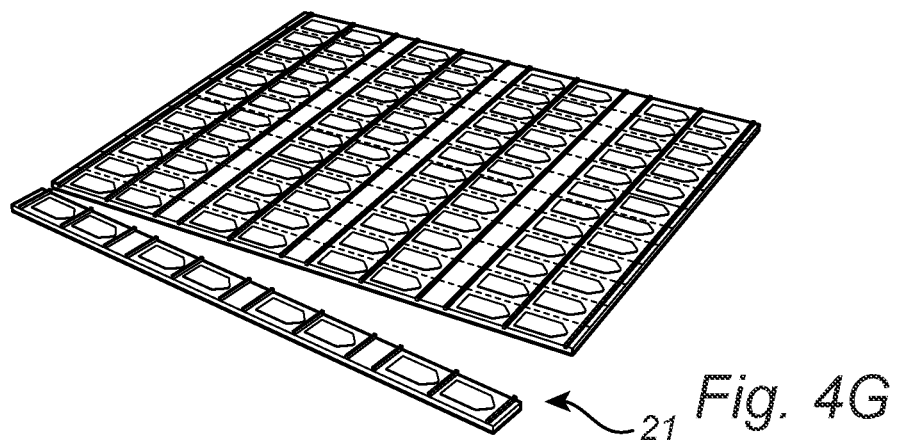
Fig. 4F
Fig. 4G

ULTRASONIC TRANSDUCER DEVICE, ACOUSTIC BIOMETRIC IMAGING SYSTEM AND MANUFACTURING METHOD

CROSS-REFERENCE TO RELATED APPLICATIONS

This application is a 371 U.S. National Stage of International Application No. PCT/SE2018/050938, filed Sep. 17, 2018, which claims priority to Swedish Patent Application No. 1751185-8, filed Sep. 22, 2017. The disclosures of each of the above applications are incorporated herein by reference in their entirety.

FIELD OF THE INVENTION

The present invention relates to ultrasonic transducer devices for use in an acoustic biometric imaging system, and a method of manufacturing such ultrasonic transducer devices.

BACKGROUND OF THE INVENTION

Biometric systems are widely used as means for increasing the convenience and security of personal electronic devices, such as mobile phones etc. Fingerprint sensing systems, in particular, are now included in a large proportion of all newly released personal communication devices, such as mobile phones.

Due to their excellent performance and relatively low cost, capacitive fingerprint sensors are used in an overwhelming majority of all biometric systems.

Among other fingerprint sensing technologies, ultrasonic sensing also has the potential to provide advantageous performance, such as the ability to acquire fingerprint (or palmprint) images from very moist fingers etc.

One class of ultrasonic fingerprint systems of particular interest are systems in which acoustic signals are transmitted along a surface of a device member to be touched by a user, and a fingerprint (palm print) representation is determined based on received acoustic signals resulting from the interaction between the transmitted acoustic signals and an interface between the device member and the user's skin.

Such ultrasonic fingerprint sensing systems, which are, for example, generally described in US 2017/0053151 may provide for controllable resolution, and allow for a larger sensing area, which may be optically transparent, without the cost of the fingerprint sensing system necessarily scaling with the sensing area.

Although the general principle of such ultrasonic fingerprint sensing is known, there appear to be remaining challenges to be overcome. For instance, it would be desirable to provide for cost-efficient mass production of ultrasonic transducer devices suitable for use in such ultrasonic fingerprint sensing systems.

SUMMARY

In view of above-mentioned and other drawbacks of the prior art, it is an object of the present invention to provide for cost-efficient mass production of improved ultrasonic transducer devices.

According to a first aspect of the present invention, it is therefore provided a method of manufacturing ultrasonic transducer devices, for use in an acoustic biometric imaging system, comprising the steps of: fabricating an ultrasonic transducer panel; and dividing the ultrasonic transducer panel into the ultrasonic transducer devices. The step of fabricating the ultrasonic transducer panel comprises the steps of: providing a first carrier; arranging a plurality of piezoelectric elements spaced apart on the carrier; arranging a plurality of integrated circuits spaced apart on the carrier; applying a dielectric material on the plurality of piezoelectric elements and on the plurality of integrated circuits to embed each piezoelectric element in the plurality of piezoelectric elements and each integrated circuit in the plurality of integrated circuits in the dielectric material, thereby forming a piezoelectric element device layer on the first carrier; thinning the piezoelectric element device layer, resulting in an exposed first side of each piezoelectric element in the plurality of piezoelectric elements; forming a first electrode layer on the piezoelectric element device layer, the first electrode layer including a first transducer electrode on the exposed first side of each piezoelectric element in the piezoelectric element device layer; and separating the piezoelectric element device layer from the first carrier.

The first carrier may be any carrier suitable for the fabrication process, and may include any carrier used in so-called wafer level fan-out processes, or in panel production processes (such as for thin film electronics). The first carrier may, for example, include a relatively rigid base covered by a temporary bond film (carrier tape). The relatively rigid base may be made of any material compatible with the particular fabrication process, and may thus, for instance, be made of silicon, glass, polymer or metal.

The dielectric material embedding the piezoelectric elements on the first carrier may, as will be known to one skilled in the art, be any dielectric embedding material suitable for the particular fabrication process. Accordingly, the dielectric material may be a molding material that may, for example be provided in granular or liquid form. Alternatively, the dielectric material may be provided in the form of a film that is laminated on the piezoelectric elements arranged on the first carrier.

The thinning step may be carried out by removing material from the piezoelectric element device layer, including from each piezoelectric element and from the dielectric material embedding each piezoelectric element. Various thinning methods that are, per se, well known include grinding, polishing/lapping, and etching.

The first electrode layer may be formed using any suitable process, such as metallization by, for example, sputtering or CVD. Alternatively, sputtering or CVD may be used for forming a seed layer for subsequent electroplating.

It should be noted that the steps of the method according to embodiments of the present invention may not necessarily need to be carried out in a particular order. For instance, the step of dividing the ultrasonic transducer panel into the ultrasonic transducer devices may be carried out before or after the step of separating the piezoelectric element device layer from the first carrier.

The present invention is based upon the realization that ultrasonic transducer devices with thin and mechanically protected piezoelectric elements and integrated circuits for interacting with the piezoelectric elements can be manufactured using a process including embedding and thinning piezoelectric elements when the piezoelectric elements and the integrated circuits are arranged spaced apart on a temporary carrier.

Embodiments of the method according to the present invention are thus suitable for inexpensive, high-yield, mass production of very small and thin ultrasonic transducer devices, particularly suitable for fingerprint sensing applications.

Since the exposed first side of each piezoelectric element results from the thinning process, a very fine surface structure of the first side of each piezoelectric element can be achieved. This in turn enables the use of a very thin first transducer electrode for reliably controlling operation of the ultrasonic transducer device. The use of a thin first transducer electrode may allow for improved acoustic coupling of the ultrasonic transducer device to a device member, which may in turn allow for the use of relatively high acoustic frequencies, which is expected to be beneficial for sensing fine features, such as fingerprint features.

Furthermore, the integrated circuits, which may for example be high-voltage ultrasonic drivers for at least one piezoelectric element and/or sensing circuits for sensing and amplifying electrical signals provided by at least one piezoelectric element, can be arranged close to its associated piezoelectric element(s) to reduce the risk of cross-talk between piezoelectric elements or groups of piezoelectric elements.

In embodiments, the piezoelectric element device layer may advantageously be thinned in such a way that each integrated circuit in the plurality of integrated circuits is completely embedded in the dielectric material following the step of thinning the piezoelectric element device layer. In other words, all sides of each integrated circuit, except the side facing the temporary first carrier, may be covered by the dielectric material. This provides for electrical and mechanical protection of the integrated circuit(s) in each ultrasonic transducer device.

In various embodiments of the method according to the present invention, the step of fabricating the ultrasonic transducer panel may further comprise the steps of: sandwiching the piezoelectric element device layer and the first electrode layer between the first carrier and a second carrier; and forming, after separating the piezoelectric element device layer from the first carrier, a second electrode layer on the piezoelectric element device layer, the second electrode layer including a second transducer electrode on a second side, opposite the first side, of each piezoelectric element in the piezoelectric element device layer.

The step of fabricating the ultrasonic transducer panel may further comprise the step of: thinning, after separating the piezoelectric element device layer from the first carrier and before forming the second electrode layer, the piezoelectric element device layer.

As an alternative to processing on both sides of the ultrasonic transducer panel, the piezoelectric elements may be metallized before attachment to the first carrier, and arranged on the first carrier with a metallized side facing the first carrier.

In embodiments, the second electrode layer may be configured to electrically connect the second transducer electrode of at least one of the piezoelectric elements in the plurality of piezoelectric elements with at least one integrated circuit in the plurality of integrated circuits; and the ultrasonic transducer panel may be divided into the ultrasonic transducer devices in such a way that each ultrasonic transducer device comprises at least a first piezoelectric element and at least a first integrated circuit, the second transducer electrode of the first piezoelectric element being electrically connected with the first integrated circuit.

According to various embodiments, furthermore, the ultrasonic transducer panel may be divided into the ultrasonic transducer devices in such a way that each ultrasonic transducer device comprises at least a first piezoelectric element and a second piezoelectric element. Hereby, the ultrasonic transducer devices become ultrasonic transducer arrays, which may facilitate assembly of the electronic device in which one or several such ultrasonic transducer arrays are included. Advantageously, the ultrasonic transducer panel may be divided in such a way as to form elongated ultrasonic transducer arrays, which may include several piezoelectric elements, such as at least 5 or at least 10 piezoelectric elements. Moreover, each ultrasonic transducer array may advantageously include at least one integrated circuit for interacting with (driving or receiving/amplifying signals from) one or several of the piezoelectric elements, and the inclusion of such integrated circuit(s) in the ultrasonic transducer array close to the piezoelectric element or elements to be interacted with may reduce the risk of cross-talk within the ultrasonic transducer array and/or electrical disturbance of other circuitry in the electronic device including the ultrasonic transducer array(s).

According to various embodiments, the step of fabricating the ultrasonic transducer panel may further comprise the step of forming, after the step of forming the first electrode layer, a spacer structure leaving at least a portion of each of the first transducer electrodes uncovered.

Such a spacer structure, which may advantageously be a dielectric spacer structure, may provide for a uniform distance between the piezoelectric element(s) comprised in the ultrasonic transducer device and the surface of a device member (such as a cover glass) to be acoustically coupled to the piezoelectric elements of the ultrasonic transducer device(s). This is expected to be particularly advantageous for embodiments in which the ultrasonic transducer device comprises a plurality of piezoelectric elements, such as a linear array of piezoelectric elements.

Advantageously, the spacer structure may be formed to define a support plane parallel with and spaced apart from a transducer electrode plane defined by the first transducer electrode of each piezoelectric element in the piezoelectric element device layer.

The spacer structure may advantageously be formed using photolithography or similar, and may advantageously be configured to define a uniform distance between each top face of the piezoelectric element(s) and a device member (such as a cover glass), while allowing excess adhesive (which may be conductive or non-conductive) to flow away and distribute when the ultrasonic transducer device is pressed against the device member. This provides for a void-free and uniform connection between the piezoelectric element(s) and the device member, which in turn provides for a good and uniform acoustic coupling between the piezoelectric element(s) and the device member.

Furthermore, a plurality of conductive vias may advantageously be provided through the piezoelectric element layer. Such conductive vias may, for example, be provided as via components arranged on the first carrier and embedded together with the piezoelectric elements. Alternatively, or in combination, conductive vias may be provided by forming holes through the dielectric embedding the piezoelectric elements, and thereafter depositing conducting material, such as metal, in the holes.

In embodiments, conductive vias extending through the piezoelectric element layer may advantageously be used to enable electrical connection to opposite sides of the piezoelectric elements from one side of the ultrasonic transducer device. To that end conductive vias may be conductively connected to a transducer electrode of each piezoelectric element in the ultrasonic transducer panel.

The possibility to electrically connect to opposite sides of the piezoelectric element(s) comprised in each ultrasonic transducer device from one side of the ultrasonic transducer element is expected to be advantageous for the manufacturing process and performance an acoustic biometric imaging system including one or several ultrasonic transducer devices. For example, there may be no need to make conductive patterns on and conductively connect control circuitry etc to a device member (such as a cover glass) to be acoustically coupled to the piezoelectric elements of the ultrasonic transducer device(s). This allows for the use of a non conductive adhesive material for attaching and acoustically coupling the ultrasonic transducer device to a device member, such as a cover glass. This, in turn, may allow for improved acoustic coupling to the device member, especially when the device member is made of glass.

According to embodiments, the ultrasonic transducer panel may be divided by cutting through the dielectric material embedding the plurality of piezoelectric elements, in such a way that dielectric material covering the edges of the piezoelectric element(s) remains after the cutting step. The term "cutting" should be understood to generally represent any way of removing dielectric material between neighboring piezoelectric elements, and includes, for example, mechanical sawing or scribing, laser cutting, water jet cutting, and etching etc.

By dividing the ultrasonic transducer panel in this manner, it can be ensured that the edges of the piezoelectric element(s) comprised in the ultrasonic transducer devices are protected, which makes the ultrasonic transducer devices more robust, and suitable for standard high volume electronics manufacturing methods, such as so-called pick-and-place operations.

According to a second aspect of the present invention, there is provided an ultrasonic transducer device for use in an acoustic biometric imaging system, the ultrasonic transducer device comprising: a first piezoelectric element having a first face, a second face opposite the first face, and side edges extending between the first face and the second face; a first transducer electrode on the first face of the first piezoelectric element; a second transducer electrode on the second face of the first piezoelectric element; and a spacer structure leaving at least a portion of the first transducer electrode of the first piezoelectric element uncovered.

According to embodiments, the ultrasonic transducer device may further comprise a second piezoelectric element having a first face, a second face opposite the first face, and side edges extending between the first face and the second face; a first transducer electrode on the first face of the second piezoelectric element; and a second transducer electrode on the second face of the second piezoelectric element, wherein the spacer structure is configured to leave at least a portion of the first transducer electrode of the second piezoelectric element uncovered. In these embodiments, the ultrasonic transducer device may be an ultrasonic transducer array, in which the piezoelectric elements may, for example, be arranged in a linear array. For instance, the ultrasonic transducer array may have an aspect ratio of at least 5:1 or at least 10:1.

The ultrasonic transducer device may further comprise a dielectric material embedding the first piezoelectric element in such a way that the side edges of the first piezoelectric element are completely covered by the dielectric material.

According to embodiments, at least one of the first transducer electrode and the second transducer electrode may partly cover the dielectric material embedding the piezoelectric element.

According to embodiments, furthermore, the dielectric material embedding the piezoelectric element may be coplanar with the first face of the piezoelectric element, at least at the side edges of the piezoelectric element.

Advantageously, the dielectric material embedding the piezoelectric element and the piezoelectric element may have been thinned in the same thinning process.

According to various embodiments, the ultrasonic transducer device may comprise a plurality of piezoelectric elements, each having a first face, a second face opposite the first face, and side edges extending between the first face and the second face; a first transducer electrode on the first face of each piezoelectric element in the plurality of the piezoelectric elements; a second transducer electrode on the second face of each piezoelectric element in the plurality of the piezoelectric elements; and an integrated circuit electrically connected to at least one of the first transducer electrode and the second transducer electrode of each piezoelectric element in the plurality of the piezoelectric elements, wherein the dielectric material embeds the integrated circuit, and embeds the plurality of piezoelectric element in such a way that the side edges of each piezoelectric element in the plurality of the piezoelectric elements are completely covered by the dielectric material.

The ultrasonic transducer device according to embodiments of the present invention may, furthermore, advantageously be included in an acoustic biometric imaging system, further comprising a controller connected to the at least one ultrasonic transducer and being configured to: receive, from the at least one ultrasonic transducer, electrical signals indicative of acoustic signals conducted by a device member and acoustically coupled to the at least one ultrasonic transducer; and form a representation of the finger surface based on the received electrical signals.

Further embodiments of, and effects obtained through this second aspect of the present invention are largely analogous to those described above for the first aspect of the invention.

BRIEF DESCRIPTION OF THE DRAWINGS

These and other aspects of the present invention will now be described in more detail, with reference to the appended drawings showing an example embodiment of the invention, wherein:

FIGS. 4A-G schematically illustrate the result of the respective method steps in the flow-chart in FIG. 3.

DETAILED DESCRIPTION OF EXAMPLE EMBODIMENTS

In the present detailed description, various embodiments of the ultrasonic transducer device according to the present invention are mainly described with reference to an ultrasonic transducer device including a first piezoelectric element and a second piezoelectric element, each having first and second transducer electrodes that are both connectable from one side of the ultrasonic transducer device. It should be noted that ultrasonic transducer devices with many other configurations also fall within the scope defined by the claims. For instance, the ultrasonic transducer device may include fewer or more piezoelectric elements, and/or may additionally include on or more integrated circuits for driving the piezoelectric element(s) and/or sensing electrical signals provided by the piezoelectric element(s). Moreover, the first and second transducer electrodes may be connectable from different sides of the ultrasonic transducer device.

Figure 1A:
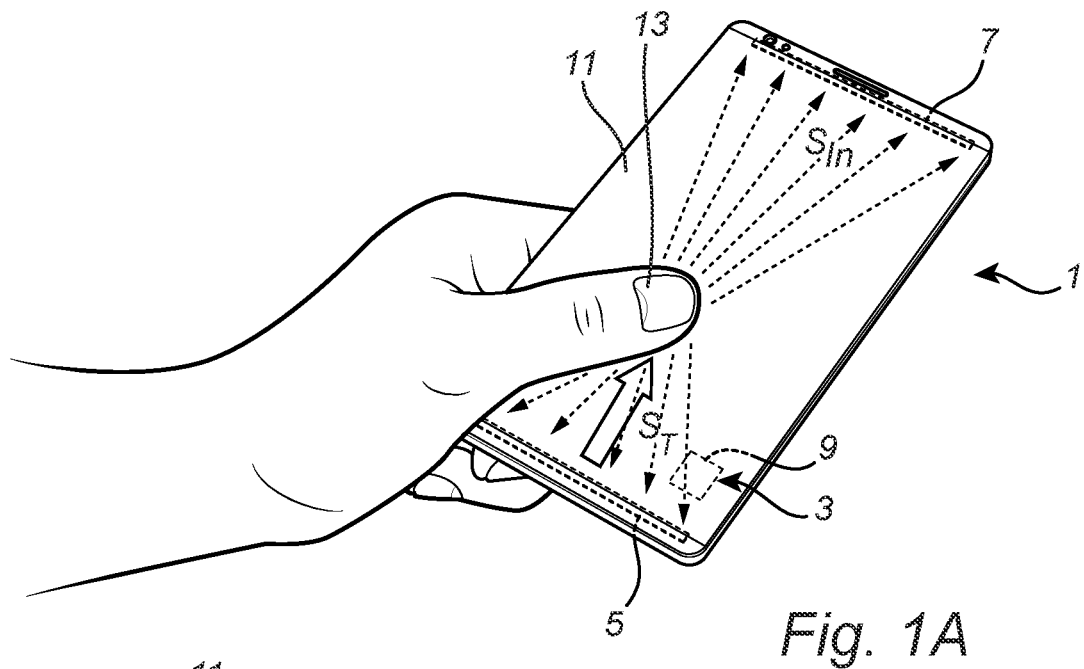
FIG. 1A is an illustration of an exemplary electronic device comprising an acoustic biometric imaging system according to an embodiment of the present invention, in the form of a mobile phone.

The acoustic biometric imaging system according to embodiments of the present invention may be included in various electronic devices. FIG. 1A schematically illustrates a representative electronic device, in the form of a mobile phone 1, comprising an acoustic biometric imaging system 3 according to an embodiment of the present invention.

As is schematically indicated in FIG. 1A, the acoustic biometric imaging system 3 comprises a first ultrasonic transducer array 5, a second ultrasonic transducer array 7, and a controller 9 connected to the first 5 and second 7 ultrasonic transducer arrays.

The first ultrasonic transducer array 5 and the second ultrasonic transducer array 7 are both acoustically coupled to a device member, here cover glass 11, of the electronic device 1 to be touched by the user. The user touch is indicated by the thumb 13 in FIG. 1A.

When the acoustic biometric imaging system 3 is in operation, the controller 9 controls one or several piezoelectric element(s) comprised in at least one of the first 5 and the second 7 ultrasonic transducer arrays to transmit an acoustic transmit signal $S_T$, indicated by the block arrow in FIG. 1A. Further, the controller 9 controls at least one of the first 5 and the second 7 ultrasonic transducer arrays to receive acoustic interaction signals $S_{In}$, indicated by the dashed arrows in FIG. 1A. The acoustic interaction signals $S_{In}$ are indicative of interactions between the transmit signal $S_T$ and the interface between the cover glass 11 and the skin of the user (thumb 13). The acoustic interaction signals $S_{In}$ are transformed to electrical signals by the receiving piezoelectric elements in the first 5 and/or second 7 ultrasonic transducer arrays, and the electrical signals are processed by the controller 9 to provide a representation of the fingerprint of the user.

The acoustic interaction signals $S_{In}$ are presently believed to mainly be due to so-called contact scattering at the contact area between the cover glass and the skin of the user (thumb 13).

The acoustic transmit signal $S_T$ may advantageously be a pulse train of short pulses (impulses), and the acoustic interaction signals $S_{In}$, which may be measured for different angles by different receiving piezoelectric elements, are impulse responses. The impulse response data carried by the acoustic interaction signals $S_{In}$ can be used to reconstruct a representation of the contact area (the fingerprint) using a reconstruction procedure similar to methods used in ultrasound reflection tomography.

It should be understood that the "representation" of the fingerprint of the user may be any information extracted based on the received acoustic interaction signals $S_{In}$, which is useful for assessing the similarity between fingerprint representations acquired at different times. For instance, the representation may comprise descriptions of fingerprint features (such as so-called minutiae) and information about the positional relationship between the fingerprint features. Alternatively, the representation may be a fingerprint image, or a compressed version of the image. For example, the image may be binarized and/or skeletonized. Moreover, the fingerprint representation may be the above-mentioned impulse response representation.

Figure 1B:
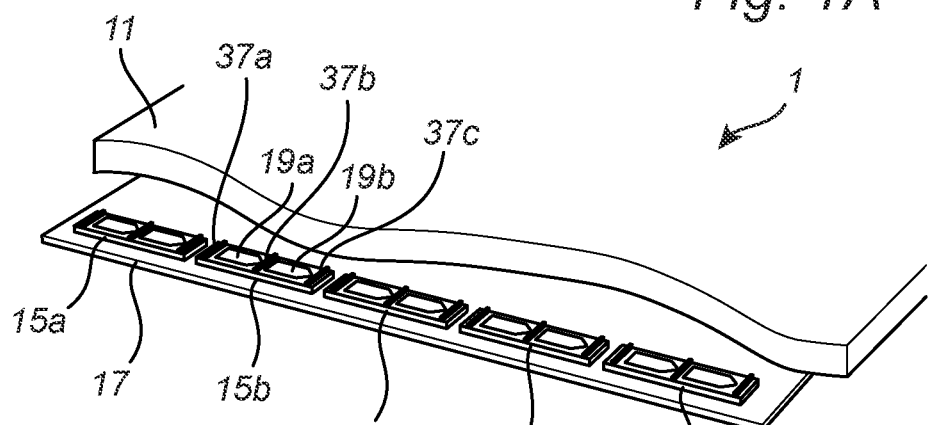
FIG. 1B is a schematic illustration of a first ultrasonic transducer device configuration in the electronic device in FIG. 1A.

FIG. 1B is a schematic illustration of a first ultrasonic transducer device configuration in the electronic device 1 in FIG. 1A, in which a plurality of ultrasonic transducer devices 15a-e are electrically and mechanically connected to a connector, here exemplified by a transducer substrate 17, and acoustically coupled to the device member (cover glass 11). In the example configuration shown in FIG. 1B, each ultrasonic transducer device 15a-e comprises a first 19a and a second 19b piezoelectric element (only indicated for one of the ultrasonic transducer devices in FIG. 1B to avoid cluttering the drawing). As is also schematically indicated in FIG. 1B, each ultrasonic transducer device 15a-e comprises spacer structures 37a-c, that are configured to define a distance between the piezoelectric elements 19a-b and the attachment surface of the cover glass 11. The spacer structures 37a-c, which may advantageously be dielectric spacer structures, are configured to allow any excess (conductive or non-conductive) adhesive or solder to escape from the area directly above the piezoelectric elements 19a-b when the ultrasonic transducer device 15a-e is pressed against the cover glass 11, thereby providing for a thin and uniform bondline thickness.

Figure 1C:
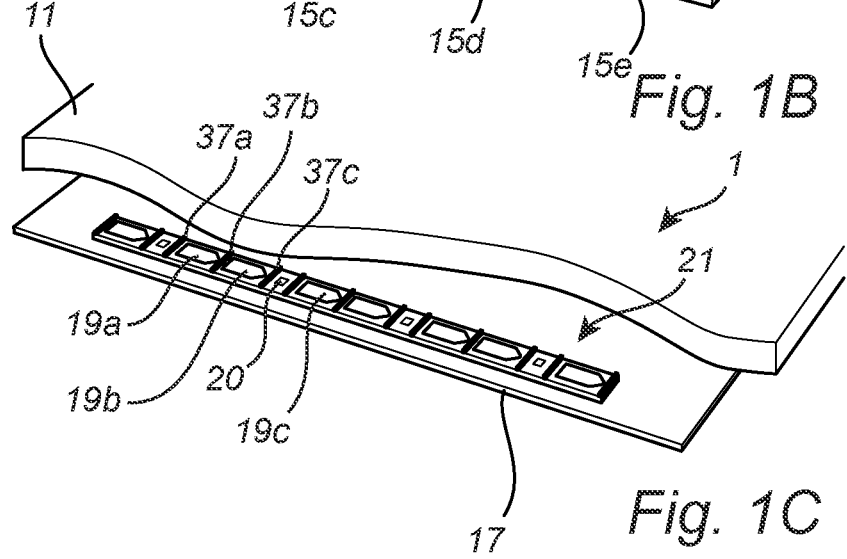
FIG. 1C is a schematic illustration of a second ultrasonic transducer device configuration in the electronic device in FIG. 1A.

FIG. 1C is a schematic illustration of a second ultrasonic transducer device configuration in the electronic device 1 in FIG. 1A, in which an ultrasonic transducer array component 21 is electrically and mechanically connected to a connector, here exemplified by a transducer substrate 17, and acoustically coupled to the device member (cover glass 11). In the example configuration shown in FIG. 1C, the ultrasonic transducer array component 21 comprises eight piezoelectric elements 19a-c (only three of these are indicated by reference numerals in FIG. 1C to avoid cluttering the drawing). As is also schematically shown in FIG. 1C, the ultrasonic transducer array component 21 in FIG. 1C further comprises four integrated circuits 20 (again, only one of these is indicated in FIG. 1C), for interfacing with the piezoelectric elements 19a-c. The integrated circuits 20, may, for example be ultrasound driver circuits for driving at least one piezoelectric element with a relatively high voltage signal, such as 12 V or more, and/or ultrasound receiver circuits. The integrated circuit 20 indicated in FIG. 1C is connected to the piezoelectric elements 19b and 19c.

To be able to achieve high quality fingerprint representations, it is expected to be beneficial to use relatively high acoustic frequencies, and to provide for a good acoustic coupling between the piezoelectric elements comprised in the ultrasonic transducer devices and the device member to be touched by the user (such as the cover glass 11). By "good acoustic coupling" should be understood a mechanical coupling with a small damping and/or distortion of the acoustic signal at the interface between the piezoelectric element(s) and the device member to be touched by the user.

To provide for high acoustic frequencies, it is expected that the piezoelectric elements should be very thin, such as around 100 µm or less.

To provide for the desired good acoustic coupling, the present inventors have realized that the transducer electrode facing the device member to be touched by the finger should be as thin and smooth (low surface roughness) as possible. It is also expected that the mechanical joint between the piezoelectric element(s) and the device member to be touched by the finger should be as thin and stiff as possible, at least for the relevant acoustic frequencies, especially for chemically strengthened glass, such as so-called gorilla glass.

At the same time, the ultrasonic transducer devices should be suitable for cost-efficient mass-production.

An example of such ultrasonic transducer devices according to an embodiment of the present invention will now be described with reference to FIGS. 2A-B, and a manufacturing method according to an embodiment of the present invention will be described further below with reference to the flow-chart in FIG. 3 and the illustrations in FIGS. 4A-G.

Figure 2A:
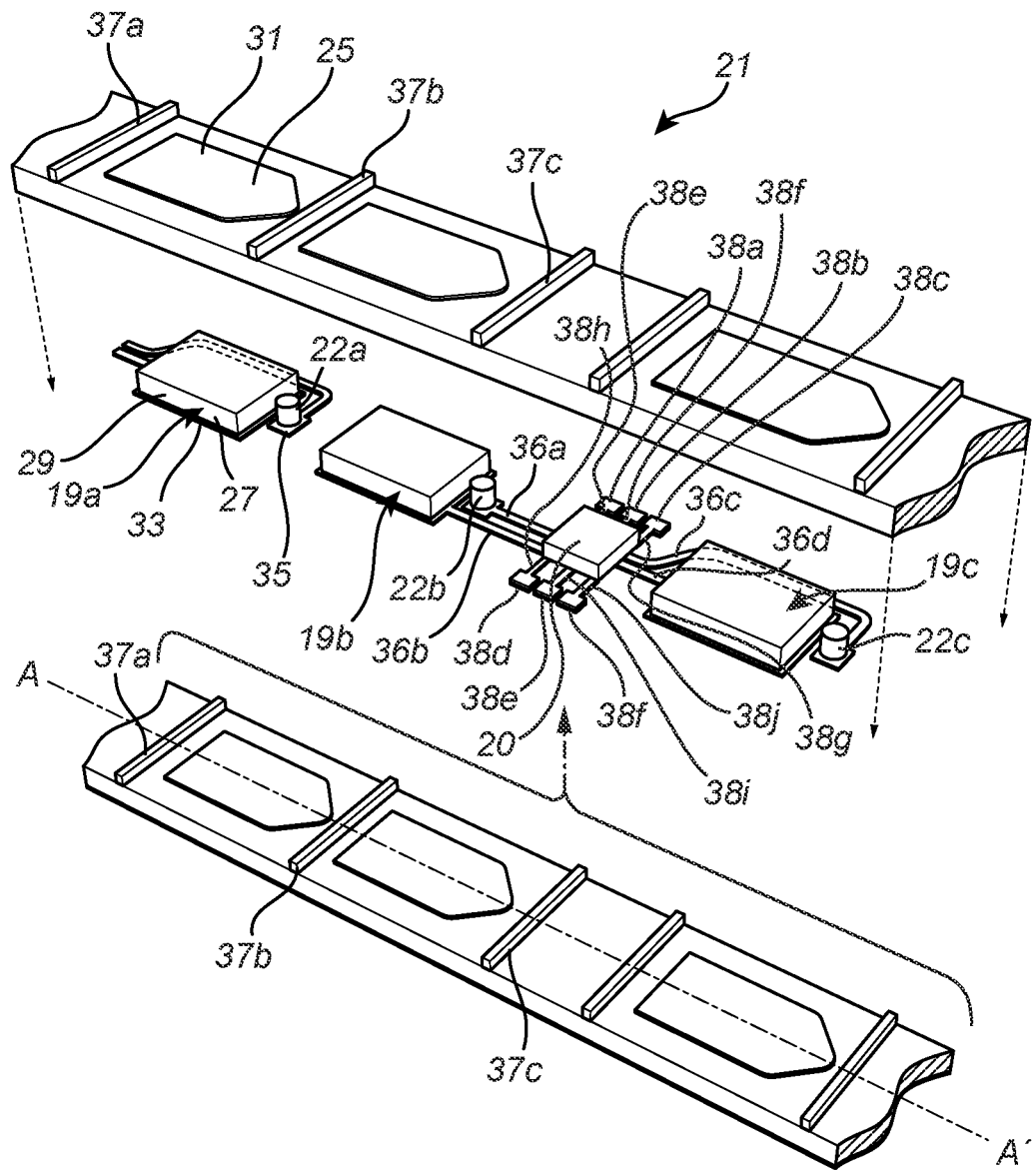
FIG. 2A is a schematic perspective view of one of the ultrasonic transducer devices in FIG. 1B.
Figure 2B:
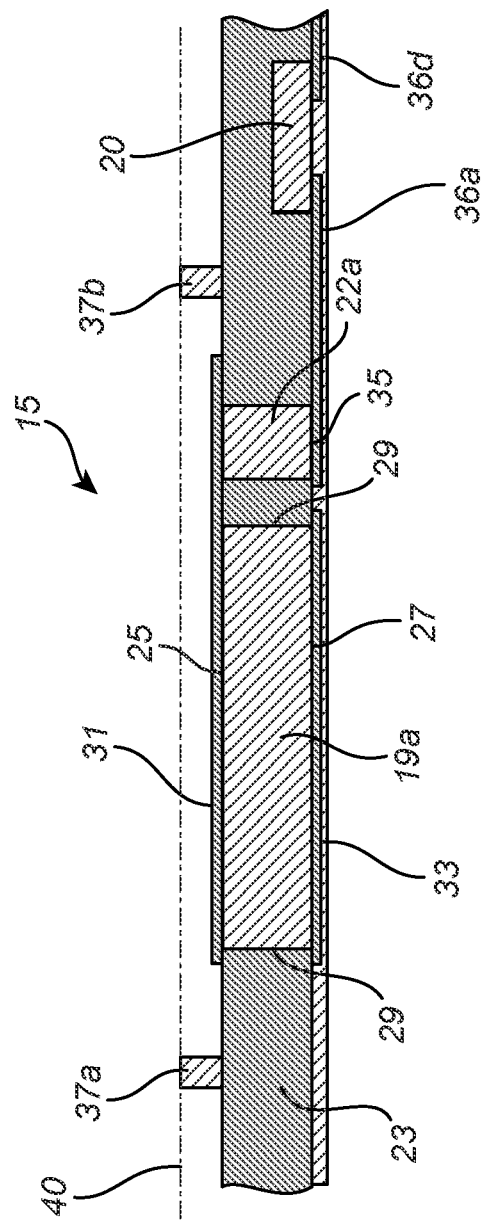
FIG. 2B is an enlarged partial cross-section view of the ultrasonic transducer device in FIG. 2A.
Figure 3:
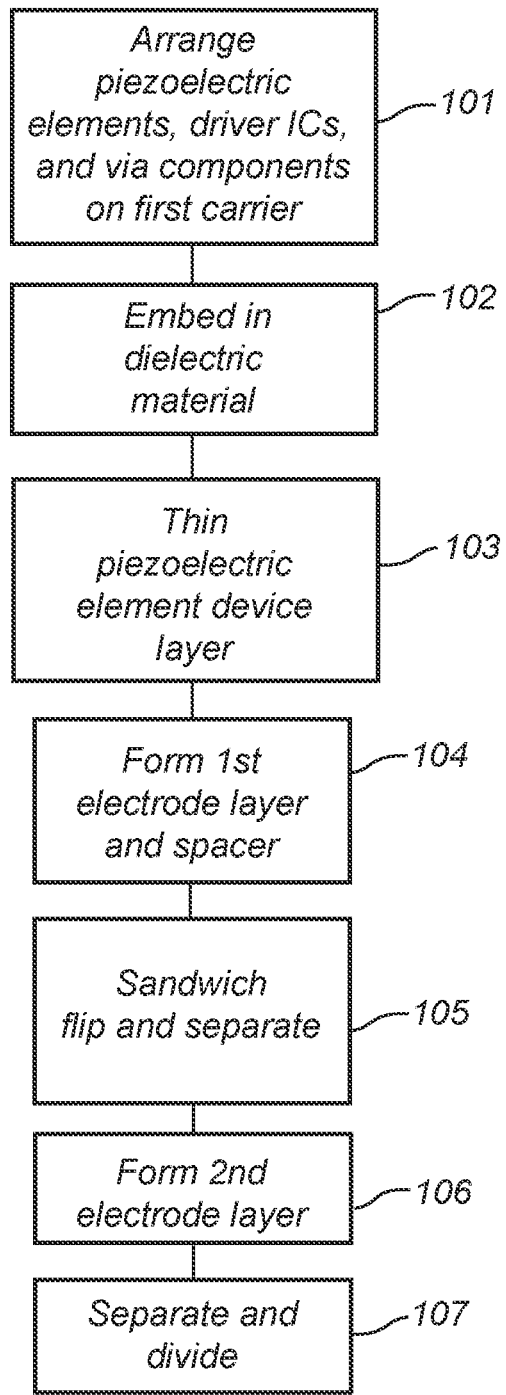
FIG. 3 is a flow-chart illustrating an example embodiment of the manufacturing method according to the present invention.

Referring first to FIG. 2A, the ultrasonic transducer device (the ultrasonic transducer array component) 21 comprises a several piezoelectric elements 19a-c, conductive vias 22a-b, integrated circuits 20, and a dielectric material 23 embedding the piezoelectric elements 19a-c, the conductive vias 22a-b, and the integrated circuits 20.

As is indicated for the first piezoelectric element 19a, each piezoelectric element has a first face 25, a second face 27, and side edges 29 extending between the first face 25 and the second face 27.

With continued reference to FIG. 2A, the ultrasonic transducer device 21 further comprises a first conductor pattern including, for each piezoelectric element, a first transducer electrode 31 on the first face 25 of the piezoelectric element, and a second conductor pattern, including, for each piezoelectric element, a second transducer electrode 33.

As is schematically indicated in FIG. 2A, the first conductor pattern connects the first transducer electrode 31 with the conductive via 22a. The second conductor pattern comprises a contact pad 35 connected to the conductive via 22a, in addition to the above-mentioned second transducer electrode 33, as well as leads 36a-j connecting the integrated circuit 20 to its related piezoelectric elements 19b-c and to pads 38a-f for connection of the integrated circuit 20 to the transducer substrate 17 (see FIG. 1C).

As is schematically indicated in FIG. 2A, a first lead 36a connects to the first transducer electrode 31 of the second piezoelectric element 19b through the via 22b and the contact pad 35, and a second lead 36b connects to the second transducer electrode 33 of the second piezoelectric element 19b. A third lead 36c connects to the first transducer electrode 31 of the third piezoelectric element 19c, and a fourth lead 36d connects to the second transducer electrode 33 of the third piezoelectric element 19c. The remaining leads 36e-j connect the integrated circuit 20 to respective connection pads 38a-f.

Although the connection pads 38a-f are indicated as being located in the vicinity of each integrated circuit 20 in FIG. 2A, it should be noted that connection pads for one or several integrated circuits may be routed to an edge of the ultrasonic transducer array 21. Such a solution is enabled by the fine line spacing that is possible to reliably achieve in the second conductor pattern. This solution may be particularly useful for embodiments where the device member is a cover glass for a mobile communication device, in which it may be beneficial to allow for relatively easy replacement of the cover glass.

Finally, as was also mentioned further above, the ultrasonic transducer device 15 in FIG. 2A comprises spacer structures 37a-c that are provided outside the area defined by the first face 25 of each piezoelectric element 19a-b, and that together define a spacer plane parallel with a plane defined by the first face of each piezoelectric element 19a-b, and spaced apart from the first transducer electrode 31 of each piezoelectric element 19a-b. The spacer structures 37a-c are also configured to allow flow of adhesive material from the space between the first transducer electrode 31 of each piezoelectric element 19a-b and the device member to be touched by the user, when the device member (cover glass 11) is attached to the ultrasonic transducer device 15. The spacer structures 37a-c conveniently provide for uniform acoustic coupling between the piezoelectric elements 19a-b (within the ultrasonic transducer device 15 and/or among different ultrasonic transducer devices 15a-e) and the device member (cover glass 11) to be touched by the user.

As may be better seen in the enlarged cross-section view, in a plane of the section taken along the line A-A' in FIG. 2A, the first transducer electrode 31 can be shaped to directly interconnect the first face 25 of the piezoelectric element 19a with the conductive via 22a. As can also be clearly seen in FIG. 2B, the edges 29 of the piezoelectric element 19a are completely covered by the embedding dielectric material 23, and as the embedding dielectric material 23 and the piezoelectric elements 19a-c have been thinned in the same thinning process, the embedding dielectric material 23 is co-planar with the first face 25 of each piezoelectric element 19a-c, at least at the side edges 29 of piezoelectric elements 19a-c. Moreover, the integrated circuit 20 is completely embedded by the dielectric material 23. As can also be seen in FIG. 2B, the spacers 37a-c define a spacer plane, represented by the line 40 in FIG. 2B, which is spaced apart from the first transducer electrodes 31 and parallel with a plane defined by the first face 25 of each piezoelectric element 19a-c.

An example method of manufacturing the ultrasonic transducer array component 21 in FIG. 1C will now be described with reference to the flow-chart in FIG. 3, and the accompanying illustrations in FIGS. 4A-G.

In a first step 101, a plurality of piezoelectric elements 19a-c, a plurality of integrated circuits, such as driver ICs 20, and a plurality of conductive via components 22a-c are arranged laterally spaced apart on a temporary first carrier 39. The piezoelectric elements 19a-c may be made of any suitable piezoelectric material, such as for example PZT.

In the subsequent step 102, a dielectric material 23 is applied on the piezoelectric elements 19a-c, on the driver ICs 20, and on the conductive via components 22a-c to embed the piezoelectric elements 19a-c, the driver ICs 20, and the conductive via components 22a-c in the embedding dielectric material, thereby forming a piezoelectric element device layer 41.

Depending on the general manufacturing process capabilities, the dielectric material may be a molding material, such as a spin-on molding material. This may typically be the case for wafer processes. Alternatively, the dielectric material may be provided in the form of a film that is laminated on the piezoelectric elements arranged on the first carrier. This may typically be the case for panel processes.

In the next step 103, the piezoelectric element device layer 41 is thinned, resulting in an exposed first face 25 of each piezoelectric element 19a-c. The driver ICs 20 are completely covered by the embedding dielectric material 23.

Following the thinning step 103, which may be carried out to achieve very thin piezoelectric elements 19a-c (such as less than 200 µm thick) with a very smooth first face 25 (such as with a surface roughness Ra<2 µm), a first electrode layer 43 is formed in step 104. The first electrode layer 43 includes a first transducer electrode 31 on the exposed first face 25 of each piezoelectric element 19a-c in the piezoelectric element device layer 41.

Figure 4A:
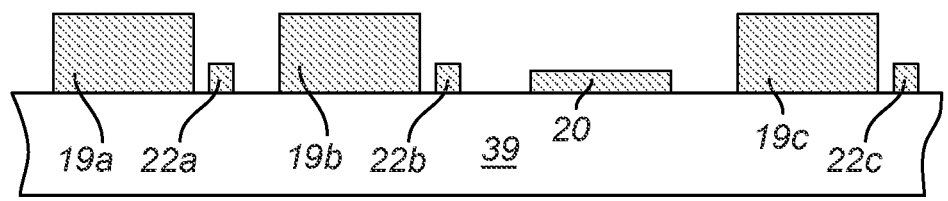
Figure 4B:
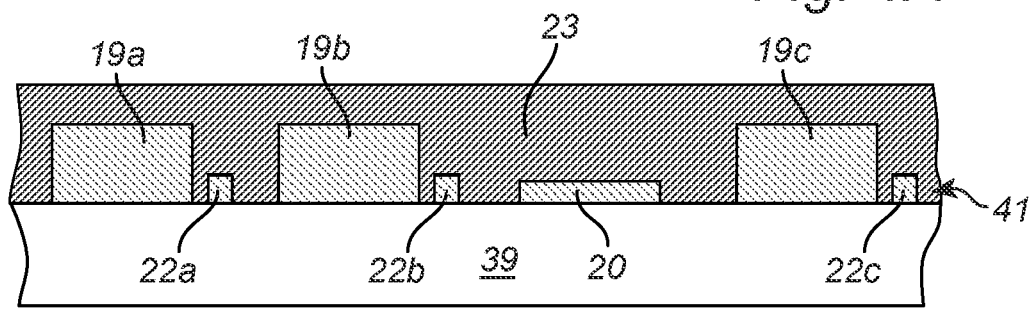
Figure 4C:
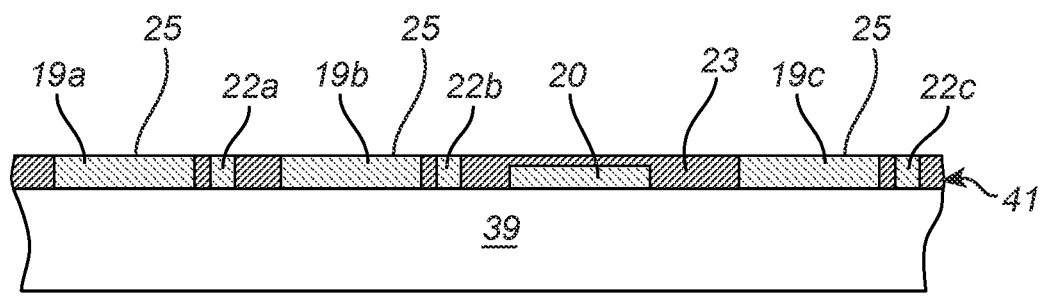
Figure 4D:
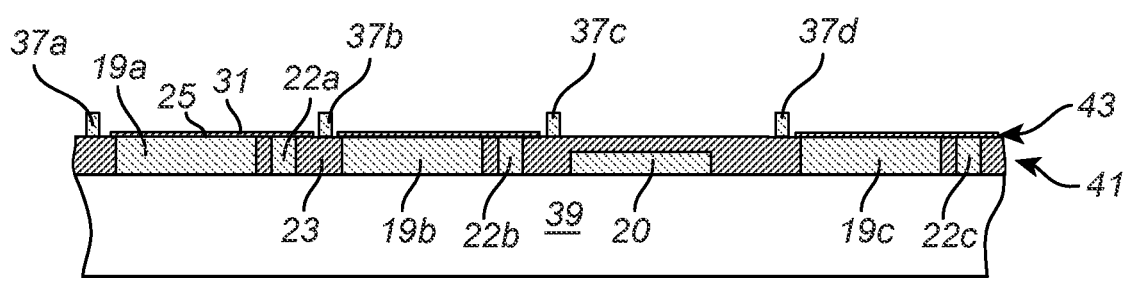

It should be noted that the first electrode layer 43 comprises conductive (such as metal) portions, and may also, as is schematically indicated in FIG. 4D, comprise non-conducting portions provided between the conductive portion. Further, spacer structures 37*a-d* are formed, for example using photolithography, as is schematically shown in FIG. 4D.

In the subsequent step 105, the piezoelectric element device layer 41 and the first electrode layer 43 are sandwiched between the temporary first carrier 39 and a temporary second carrier 45, the "sandwich" is flipped over, and the temporary first carrier 39 is separated from the piezoelectric element device layer 41 and removed, as is indicated in FIG. 4E.

In the next step 106, a second electrode layer 47 is formed, optionally following thinning and/or polishing to achieve a smooth surface structure also on the second face 27 of each piezoelectric element 19*a-c*. As described above in connection with FIGS. 2A-B, the second electrode layer 47 may comprise, for each of said piezoelectric elements 19*a-c*, a second transducer electrode 31 on the second face 27, a contact pad 35 connected to each conductive via 22*a-c*, leads 36*a-j* connecting the integrated circuit 20 to its related piezoelectric elements 19*b-c* and to pads 38*a-f* for connection of the integrated circuit 20 to the transducer substrate 17 (also see FIG. 1C).

Finally, in step 107, the temporary second carrier 45 is separated from the first electrode layer 43, and the ultrasonic transducer panel is divided into ultrasonic transducer array components 21 as is schematically indicated in FIG. 4G.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A method of manufacturing ultrasonic transducer devices, for use in an acoustic biometric imaging system, comprising the steps of:
    fabricating an ultrasonic transducer panel; and
    dividing said ultrasonic transducer panel into said ultrasonic transducer devices,
    wherein the step of fabricating said ultrasonic transducer panel comprises the steps of:
        providing a first carrier;
        arranging a plurality of piezoelectric elements spaced apart on said carrier;
        arranging a plurality of integrated circuits spaced apart on said carrier;
        applying a dielectric material on said plurality of piezoelectric elements and on said plurality of integrated circuits to embed each piezoelectric element of said plurality of piezoelectric elements and each integrated circuit of said plurality of integrated circuits in said dielectric material, thereby forming a piezoelectric element device layer on said first carrier;
        thinning said piezoelectric element device layer, resulting in an exposed first side of each piezoelectric element of said plurality of piezoelectric elements;
        forming a first electrode layer on said piezoelectric element device layer, said first electrode layer including a first transducer electrode on the exposed first side of each piezoelectric element in said piezoelectric element device layer; and
        separating said piezoelectric element device layer from said first carrier.

2. The method according to claim 1, wherein said piezoelectric element device layer is thinned in such a way that each integrated circuit of said plurality of integrated circuits is completely embedded in said dielectric material following the step of thinning said piezoelectric element device layer.

3. The method according to claim 1, wherein the step of fabricating said ultrasonic transducer panel further comprises the steps of:
    sandwiching said piezoelectric element device layer and said first electrode layer between said first carrier and a second carrier; and
    forming, after separating said piezoelectric element device layer from said first carrier, a second electrode layer on said piezoelectric element device layer, said second electrode layer including a second transducer electrode on a second side, opposite said first side, of each piezoelectric element in said piezoelectric element device layer.

4. The method according to claim 3, wherein said second electrode layer is configured to electrically connect the second transducer electrode of at least one of said piezoelectric elements of said plurality of piezoelectric elements with at least one integrated circuit of said plurality of integrated circuits; and
    said ultrasonic transducer panel is divided into said ultrasonic transducer devices in such a way that each ultrasonic transducer device comprises at least a first piezoelectric element and at least a first integrated circuit, the second transducer electrode of said first piezoelectric element being electrically connected with said first integrated circuit.

5. The method according to claim 1, wherein said ultrasonic transducer panel is divided into said ultrasonic transducer devices in such a way that each ultrasonic transducer device comprises at least a first piezoelectric element and a second piezoelectric element.

6. The method according to claim 1, wherein the step of fabricating said ultrasonic transducer panel further comprises the step of:
    providing a plurality of conductive vias through said piezoelectric element layer.

7. The method according to claim 6, wherein said first electrode layer is formed in such a way that each first transducer electrode is conductively connected to at least one conductive via of said plurality of conductive vias.

8. The method according to claim 1, wherein said ultrasonic transducer panel is divided by cutting through said dielectric material embedding said plurality of piezoelectric elements.

* * * * *